(12) United States Patent
Senoo et al.

(10) Patent No.: US 10,043,999 B2
(45) Date of Patent: Aug. 7, 2018

(54) ELECTROLUMINESCENCE DEVICE, ELECTRONIC DEVICE, AND METHOD FOR MANUFACTURING ELECTROLUMINESCENCE DEVICE

(71) Applicant: Sharp Kabushiki Kaisha, Sakai, Osaka (JP)

(72) Inventors: Tohru Senoo, Sakai (JP); Takeshi Hirase, Sakai (JP); Tetsuya Okamoto, Sakai (JP); Tohru Sonoda, Sakai (JP); Mamoru Ishida, Sakai (JP); Seiji Fujiwara, Sakai (JP); Daichi Nishikawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/511,740

(22) PCT Filed: Sep. 17, 2015

(86) PCT No.: PCT/JP2015/076401
§ 371 (c)(1),
(2) Date: Mar. 16, 2017

(87) PCT Pub. No.: WO2016/043255
PCT Pub. Date: Mar. 24, 2016

(65) Prior Publication Data
US 2017/0263892 A1    Sep. 14, 2017

(30) Foreign Application Priority Data

Sep. 18, 2014 (JP) ................................ 2014-190473

(51) Int. Cl.
*H01L 27/15* (2006.01)
*H01L 29/24* (2006.01)
(Continued)

(52) U.S. Cl.
CPC ...... *H01L 51/5253* (2013.01); *H01L 51/0097* (2013.01); *H01L 51/56* (2013.01); *H01L 2251/5338* (2013.01); *H01L 2251/558* (2013.01)

(58) Field of Classification Search
CPC ............. H01L 2251/5338; H01L 33/38; H01L 23/4985; H01L 51/0097; H01L 51/5253;
(Continued)

(56) References Cited

U.S. PATENT DOCUMENTS 9,214,640 B2* 12/2015 Lee ..................... H01L 51/0097
9,351,349 B2* 5/2016 Sakamoto ............. H05B 33/10
(Continued)

FOREIGN PATENT DOCUMENTS

JP    2003-017244 A    1/2003
JP    2007-010834 A    1/2007
(Continued)

OTHER PUBLICATIONS

Official Communication issued in International Patent Application No. PCT/JP2015/076401, dated Dec. 15, 2015.

*Primary Examiner* — Hsien Ming Lee
(74) *Attorney, Agent, or Firm* — Keating & Bennett, LLP

(57) ABSTRACT

In an organic EL display device (electroluminescence device) including a flexible TFT substrate (substrate), an organic EL element (electroluminescence element) provided on the TFT substrate, and a sealing film that seals the organic EL element, a foldable bend portion is provided. The film thickness of the sealing film is reduced at the bend portion.

21 Claims, 13 Drawing Sheets

(51) Int. Cl.
*H01L 21/00* (2006.01)
*H01L 51/52* (2006.01)
*H01L 51/00* (2006.01)
*H01L 51/56* (2006.01)

(58) Field of Classification Search
CPC .... H01L 27/3251; H05K 1/118; H05K 1/189; H05K 3/361; H05K 2201/042; H05K 2201/05
USPC ....... 257/40, 79, 81, 99, 100; 438/24–26, 29
See application file for complete search history.

(56) References Cited

U.S. PATENT DOCUMENTS

| | | |
|---|---|---|
| 9,691,345 B2 * | 6/2017 | Park .................... G09G 5/00 |
| 2010/0187986 A1 | 7/2010 | Kajitani et al. |
| 2010/0293782 A1 | 11/2010 | Yamazaki et al. |
| 2014/0300270 A1 | 10/2014 | Sakamoto |

FOREIGN PATENT DOCUMENTS

| | | |
|---|---|---|
| JP | 2009-037812 A | 2/2009 |
| WO | 2014/017075 A1 | 1/2014 |

\* cited by examiner

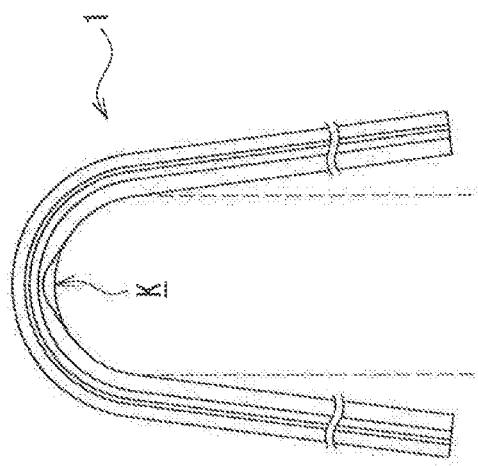
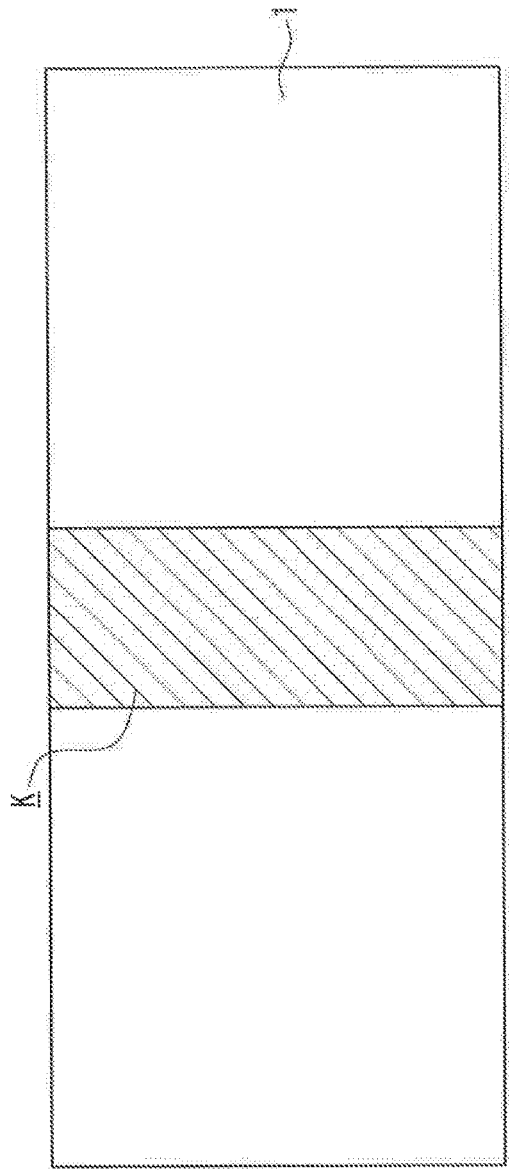
FIG. 3(a)
FIG. 3(b)

US 10,043,999 B2

ELECTROLUMINESCENCE DEVICE, ELECTRONIC DEVICE, AND METHOD FOR MANUFACTURING ELECTROLUMINESCENCE DEVICE

TECHNICAL FIELD

The present invention relates to an electroluminescence device having an EL (electroluminescence) element, an electronic device using the same, and a method for manufacturing the electroluminescence device.

BACKGROUND ART

In recent years, flat panel displays are used in a variety of commercial products and fields, and there is demand to further increase the size, improve the image quality, and reduce the power consumption of flat panel displays.

In these circumstances, organic EL display devices equipped with organic EL (electroluminescence) elements that use the electroluminescence (Electro Luminescence) of organic materials are recognized as all-solid-state flat panel displays that are excellent in terms of their low-voltage driving capability, fast responsiveness, self-luminous properties, and the like, and are attracting considerable attention.

Also, such organic EL display devices are used as display portions of electronic devices such as electronic books, personal computers, or tablets.

Moreover, for example, in an active-matrix organic EL display device, a thin film organic EL element is provided on a substrate on which a TFT (thin-film transistor) is provided. In the organic EL element, an organic EL layer including a light emitting layer is laminated between a pair of electrodes. The TFT is connected to one of the pair of electrodes. When a voltage is applied across the pair of electrodes, the light emitting layer emits light, and thus an image is displayed.

Moreover, with respect to an organic EL display device such as that described above, a proposal has been made to prevent deterioration of an organic EL element that is caused by moisture or oxygen by providing a sealing film on the organic EL element and sealing the organic EL element with the sealing film.

Moreover, with respect to a conventional organic EL display device such as that described above, as disclosed in Patent Document 1 below, for example, a proposal has been made to provide a sealing film on an organic EL element, the sealing film being constituted by an organic film and an inorganic film that are alternately laminated. It has been considered that deterioration of the organic EL element of this conventional organic EL display device due to moisture or oxygen can be prevented by the sealing film.

CITATION LIST

Patent Document

Patent Document 1: JP 2009-37812A

DISCLOSURE OF INVENTION

Problem to be Solved by the Invention

Incidentally, a method of forming a foldable display portion in conventional organic EL display devices such as those described above by using a flexible substrate as the above-described substrate has been coming into practical use.

However, in conventional organic EL display devices such as those described above, there are cases where the above-described sealing film peels off when the organic EL display devices are bent. This results in a problem in that the reliability of these conventional organic EL display devices significantly decreases.

In view of the above-described issue, an object of the present invention is to provide an electroluminescence device having excellent reliability in which the sealing film can be prevented from peeling off even when the electroluminescence device is bent, an electronic device using the electroluminescence device, and a method for manufacturing the electroluminescence device.

Means for Solving Problem

In order to attain the above-described object, an electroluminescence device according to the present invention is an electroluminescence device including a flexible substrate, an electroluminescence element that is provided on the substrate, and a sealing film that seals the electroluminescence element, wherein the electroluminescence device is provided with a foldable bend portion, and a film thickness of the sealing film is reduced at the bend portion.

In the electroluminescence device that is configured as described above, a foldable bend portion is provided. Moreover, at the bend portion, the film thickness of the sealing film is reduced. As a result, unlike the above-described conventional examples, it is possible to configure an electroluminescence device having excellent reliability in which a sealing film can be prevented from peeling off even when the electroluminescence device is folded.

Moreover, in the electroluminescence device, the electroluminescence device may be provided with a plurality of said bend portions, and the film thickness of the sealing film may be reduced at the plurality of bend portions.

In this case, the electroluminescence device can be folded at a plurality of bend portions.

Moreover, the electroluminescence device may further include an opposing substrate that opposes the substrate; and a frame-shaped seal material that is provided between the substrate and the opposing substrate and that encloses the electroluminescence element together with the substrate and the opposing substrate.

In this case, deterioration of the electroluminescence element can be more reliably prevented.

Moreover, in the electroluminescence device, the sealing film may have a plurality of protruding portions at the bend portion, the film thickness of the plurality of protruding portions being reduced and the plurality of protruding portions being formed in a mesh-shaped pattern.

In this case, the plurality of protruding portions make it possible to easily bend the bend portion.

Moreover, in the electroluminescence device, the sealing film may have a plurality of protruding portions at the bend portion, the film thickness of the plurality of protruding portions being reduced and the plurality of protruding portions being formed parallel to each other while being spaced apart from each other by a predetermined distance.

In this case, the plurality of protruding portions make it possible to easily bend the bend portion.

Moreover, in the electroluminescence device, it is preferable that the sealing film includes at least an inorganic film.

In this case, it is possible to more reliably prevent moisture from having an adverse effect on the electroluminescence element.

Moreover, in the electroluminescence device, it is preferable that the sealing film has a laminated structure including an inorganic film and an organic film.

In this case, the sealing properties of the sealing film can be easily improved.

Moreover, in the electroluminescence device, in the sealing film, an organic film may be provided sandwiching the bend portion.

In this case, in the sealing film, no organic film is provided at the bend portion, and thus, the sealing film can be easily prevented from peeling off at the bend portion.

Moreover, in the electroluminescence device, at the bend portion, an elastic resin material may be provided on the sealing film.

In this case, it is possible to easily improve the strength of the electroluminescence device while suppressing a decrease in the ease of folding of the bend portion.

Moreover, an electronic device of the present invention is an electronic device using any of the above-described electroluminescence devices.

In the electronic device that is configured as described above, an electroluminescence device having excellent reliability in which a sealing film can be prevented from peeling off even when the electroluminescence device is folded is used, and thus, a highly-reliable, long-life electronic device can be configured.

Moreover, a method for manufacturing an electroluminescence device of the present invention is a method for manufacturing an electroluminescence device which includes a flexible substrate, an electroluminescence element that is provided on the substrate, and a sealing film that seals the electroluminescence element and in which a foldable bend portion is provided, the method including the steps of forming the electroluminescence element on the substrate; and forming the sealing film on the electroluminescence element, wherein during the step of forming the sealing film, the sealing film is formed such that the film thickness of the sealing film is reduced at the bend portion.

In the method for manufacturing an electroluminescence device, the method being configured as described above, during the step of forming the sealing film, the sealing film is formed such that the film thickness of the sealing film is reduced at the bend portion. As a result, unlike the above-described conventional examples, it is possible to configure an electroluminescence device having excellent reliability in which a sealing film can be prevented from peeling off even when the electroluminescence device is folded.

Effects of the Invention

According to the present invention, it is possible to provide an electroluminescence device having excellent reliability in which a sealing film can be prevented from peeling off even when the electroluminescence device is folded, an electronic device using the electroluminescence device, and a method for manufacturing the electroluminescence device.

BRIEF DESCRIPTION OF DRAWINGS

FIGS. 3(a) and 3(b) are diagrams for explaining a bend portion provided in the organic EL display device.

FIG. 4 shows diagrams for explaining main manufacturing steps for the organic EL display device.

FIG. 5 shows diagrams for explaining main manufacturing steps for the organic EL display device.

DESCRIPTION OF THE INVENTION

Figure 1:
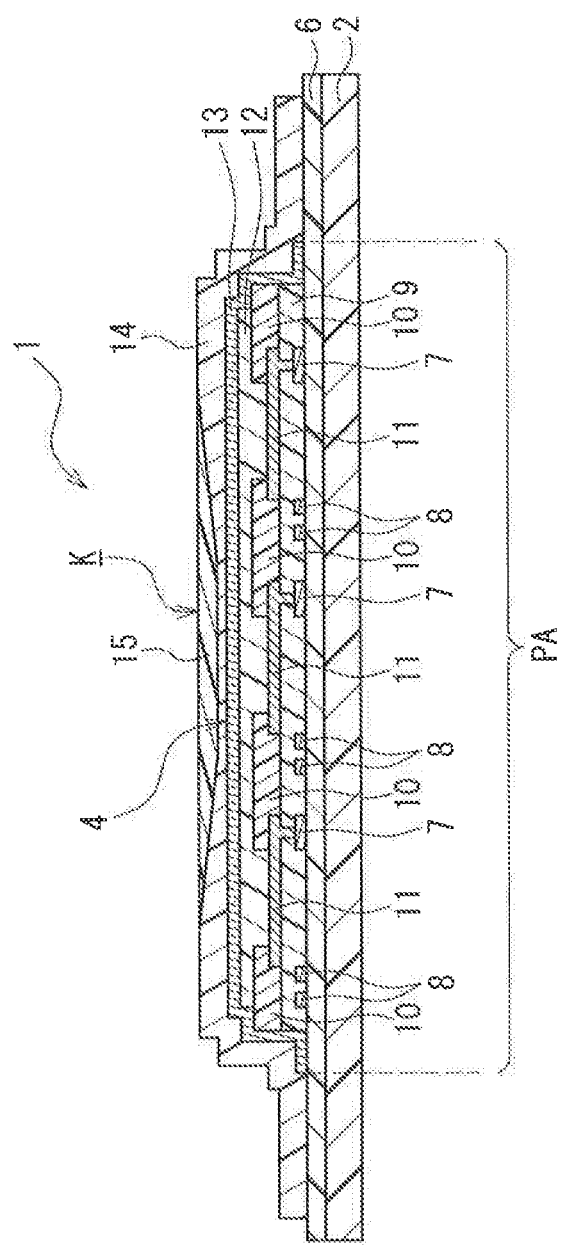
FIG. 1 is a cross-sectional view showing a cross section of an organic EL display device according to a first embodiment of the present invention.

Hereinafter, preferred embodiments of an electroluminescence device, an electronic device, and a method for manufacturing the electroluminescence device of the present invention will be described with reference to the drawings. It should be noted that in the following description, a case where the present invention is applied to an organic EL display device will be described by way of example. Moreover, it should be understood that the dimensions of various constituent members in the drawings are not faithful representations of the dimensions of actual constituent members, dimensional ratios of those constituent members, and the like.

First Embodiment

FIG. 1 is a cross-sectional view showing a cross section of an organic EL display device according to a first embodiment of the present invention. In FIG. 1, an organic EL display device 1 of the present embodiment includes a TFT substrate 2 serving as a substrate and an organic EL element 4 serving as an electroluminescence (Electro Luminescence) element, the organic EL element 4 being provided on the TFT substrate 2.

The organic EL display device 1 of the present embodiment is configured to be applicable as a display portion of an electronic device such as an electronic book, a personal computer, or a tablet, for example, and is adapted to be able to display various kinds of information as the display portion of the electronic device.

In the organic EL display device 1 of the present embodiment, the organic EL element 4 constitutes a rectangular pixel area PA having a plurality of pixels (including a plurality of subpixels), and this organic EL element 4 is sealed by a sealing film 14, which will be described later. Also, this pixel area PA constitutes a display portion of the organic EL display device 1 and is adapted to display information. That is to say, in this pixel area PA, the plurality of pixels (plurality of subpixels) are arranged in a matrix, and information is displayed by the organic EL element 4 emitting light on a subpixel-by-subpixel basis. It should be noted that, for example, RGB subpixels respectively having red (R), green (G), and blue (B) colors are provided as the plurality of subpixels.

Moreover, in the organic EL display device 1 of the present embodiment, a foldable bend portion K is provided at a central portion of the pixel area PA (i.e., central portion of the organic EL display device 1 with respect to the left-right direction), for example. As will be described in detail later, the organic EL display device 1 of the present embodiment is configured to be able to display information in a state in which the device is folded at the bend portion K.

In FIG. 1, the TFT substrate 2 is composed of, for example, a film or the like that has flexibility (bendability). A base film (insulation film) 6 is provided on the TFT substrate 2 such that the base film 6 covers the entire surface of the TFT substrate 2. As shown in FIG. 1 by way of example, in the organic EL display device 1, TFTs (thin-film transistors) 7 for the respective subpixels of the pixel area PA are provided on this base film 6. Also, an interconnect 8 is formed on the base film 6, the interconnect 8 including a plurality of source lines (signal lines) and a plurality of gate lines that are arranged in a matrix. The source lines and the gate lines are connected to a source driver and a gate driver (not shown), respectively, and are adapted to drive the TFTs 7 for the respective subpixels in response to image signals input from the outside. Moreover, the TFTs 7 function as switching elements that control light emission of the corresponding subpixels, and are adapted to control light emission of the subpixels constituted by the organic EL element 4 and individually emitting the red (R), green (G), or blue (B) color.

It should be noted that the base film 6 is used to prevent deterioration in the characteristics of the TFTs 7 due to impurity diffusion from the TFT substrate 2 to the TFTs 7, and may be omitted if there is no need for concern about such deterioration.

Moreover, in the case where the TFT substrate 2 is a film having flexibility, in order to prevent deterioration of the TFTs 7 and the organic EL element 4 due to moisture or oxygen permeating through (intruding) from the outside, a damp-proof layer constituted by an inorganic film made from silicon nitride, silicon oxynitride, or the like may also be formed on the TFT substrate 2 in advance.

Moreover, as shown in FIG. 1, an interlayer insulation film 9, edge covers 10, and first electrodes 11 of the organic EL element 4 are formed on the TFT substrate 2. The interlayer insulation film 9 functions also as a planarization film and is provided on the base film 6 so as to cover the TFTs 7 and the interconnect 8. The edge covers 10 are formed on the interlayer insulation film 9 such that the edge covers 10 cover pattern end portions of each of the first electrodes 11. The edge covers 10 are adapted to function also as an insulation layer for preventing short-circuiting of the first electrodes 11 and a second electrode 13, which will be described later. Moreover, the first electrodes 11 are connected to the TFTs 7 through contact holes that are formed in the interlayer insulation film 9.

Moreover, openings in the edge covers 10, that is, portions through which the first electrodes 11 are exposed substantially constitute light-emitting regions of the organic EL element 4, which individually emit light in R, G, or B color as described above, and thus, the organic EL display device 1 of the present embodiment is configured to be capable of displaying in full color. Moreover, the organic EL display device 1 of the present embodiment constitutes an active-matrix display device having the TFTs (thin-film transistors) 7.

Moreover, as shown in FIG. 1, an organic EL layer 12 and the second electrode 13 are formed on the first electrodes 11. The organic EL element 4 is constituted by the first electrodes 11, the organic EL layer 12, and the second electrode 13. That is to say, the organic EL element 4 may be, for example, a light-emitting element capable of emitting light with high luminance by being driven with a low-voltage direct current, and includes the first electrodes 11, the organic EL layer 12, and the second electrode 13.

More specifically, in the case where the first electrodes 11 are anodes, a hole injection layer, a hole transport layer, a light-emitting layer, an electron transport layer, an electron injection layer, and the like are laminated (not shown) in that order from the first electrodes 11 side and together serve as the organic EL layer 12, and the second electrode 13 serving as a cathode is further formed thereon. Besides the above-described configuration, a configuration may also be adopted in which a single layer has two or more functions in such a manner that a hole injection layer doubles as a hole transport layer, for example. Also, a carrier blocking layer and the like may be inserted in the organic EL layer 12 as appropriate.

On the other hand, in the case where the second electrode 13 is an anode, the above-described order of the layers in the organic EL layer 12 is reversed.

Moreover, in the case where the first electrodes 11 are each constituted by a transparent electrode or a semi-transparent electrode and the second electrode 13 is constituted by a reflective electrode, the organic EL display device 1 is of a bottom emission type that emits light from the TFT substrate 2 side. That is to say, in this bottom emission-type organic EL display device 1, the surface of each first electrode 11 that faces toward the TFT substrate 2 constitutes a substantial light-emitting surface of the organic EL element 4 and is adapted to emit light outward.

Conversely, in the case where the first electrodes 11 are each constituted by a reflective electrode and the second electrode 13 is constituted by a transparent electrode or a semi-transparent electrode, the organic EL display device 1 is of a top emission type that emits light from the sealing film 14. That is to say, in this top emission-type organic EL display device 1, the surface of each first electrode 11 that faces toward the sealing film 14 constitutes a substantial light-emitting surface of the organic EL element 4 and is adapted to emit light outward.

In the organic EL display device 1 of the present embodiment, as described above, the organic EL element 4 is sealed by the sealing film 14, and deterioration of the organic EL element 4 is prevented by the sealing film 14 preventing moisture and oxygen permeating through (intruding) from the outside.

The sealing film 14 is constituted by an inorganic film made from, for example, silicon nitride, silicon oxide, silicon oxynitride, aluminum oxide, or the like. Moreover, the sealing film 14 is formed such that the film thickness at the above-described bend portion K is thinner than the film thickness at portions other than the bend portion K. More specifically, the sealing film 14 is formed by using CVD, vapor deposition, or sputtering, for example, and the sealing film 14 is formed such that, as shown in FIG. 1, its film thickness is gradually reduced from both the left and right end portions toward the bend portion K and is thinnest at the bend portion K (details will be described later). In this manner, the film thickness of the sealing film 14 is reduced at the bend portion K, and therefore, it is possible to prevent the sealing film 14 from peeling off even when the sealing film 14 is folded at the bend portion K.

Moreover, in the organic EL display device 1 of the present embodiment, as shown in FIG. 1, in a recessed portion of the sealing film 14 where the film thickness of the sealing film 14 is reduced, a resin material 15 is provided on the sealing film 14 such that the recessed portion is filled with the resin material 15. An elastic resin material, such as epoxy resin or acrylic resin, for example, is used as the resin material 15, and the resin material 15 has the function of planarizing the sealing film 14 by filling in the recessed portion.

In the case where the organic EL display device 1 is of a top emission type, a transparent material is used as the resin material 15. On the other hand, in the case where the organic EL display device 1 is of a bottom emission type, transparent and non-transparent materials may be used as the resin material 15. Furthermore, a material in which particles having a moisture absorbing function, such as particles of a metal oxide such as aluminum hydroxide or calcium oxide or activated carbon, for example, are dispersed in a resin can be used as the resin material 15.

Now, the bend portion K of the organic EL display device 1 of the present embodiment will be specifically described with reference to FIGS. 2 and 3.

Figure 2:
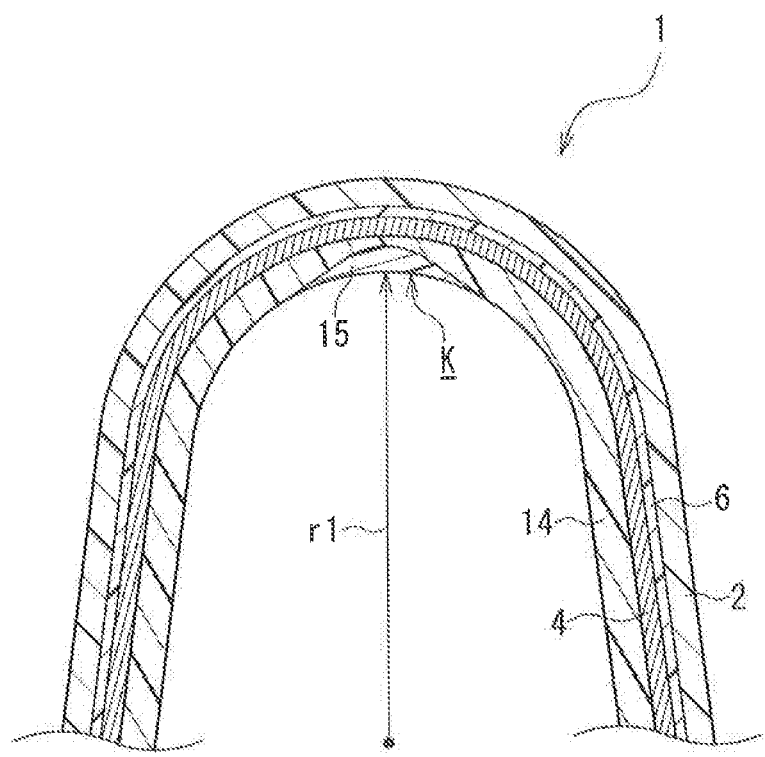
FIG. 2 is an explanatory diagram for explaining the organic EL display device in a folded state.

FIG. 2 is an explanatory diagram for explaining the above-described organic EL display device in a folded state. FIGS. 3(a) and 3(b) are diagrams for explaining the bend portion provided in the above-described organic EL display device.

As shown in FIG. 2, the organic EL display device 1 of the present embodiment is configured so as to be able to be folded at the bend portion K with the sealing film 14 being located on the inner side, for example.

It should be noted that besides this configuration, a configuration can also be adopted in which the organic EL display device 1 is folded at the bend portion K with the sealing film 14 being located on the outer side.

Moreover, as shown in FIGS. 3(a) and 3(b), in the organic EL display device 1 of the present embodiment, the bend portion K is set at the central portion of the organic EL display device 1. Moreover, the organic EL display device 1 of the present embodiment is configured such that when the device is folded, the bend portion K is folded with a radius of curvature (indicated by "r1" in FIG. 2) of about several millimeters, for example.

Moreover, in the organic EL display device 1 of the present embodiment, since the film thickness of the sealing film 14 is partially reduced, even when the organic EL display device 1 is folded as shown in FIG. 3(a) by way of example, the sealing film 14 can be prevented from peeling off. That is to say, in the case where the film thickness of the sealing film is reduced over the entire sealing film, when the organic EL display device is folded at a bend portion, in the sealing film 14, the stress caused by folding is concentrated, centered at a portion of the sealing film 14 where the bend portion is located, and thus, the sealing film 14 may peel off, starting at the portion where the bend portion is located.

In contrast, according to the present embodiment, since the film thickness of the sealing film 14 is partially reduced at the bend portion K, even when the organic EL display device 1 is folded and stress is generated in the sealing film 14, the sealing film 14 can be prevented from peeling off. Moreover, since the resin material 15 is made using an elastic material, even when the organic EL display device 1 is folded, the occurrence of peeling-off of the sealing film 14 is not promoted.

Next, a method for manufacturing the organic EL display device 1 of the present embodiment will be specifically described with reference to FIGS. 4 to 7.

Figure 4A:
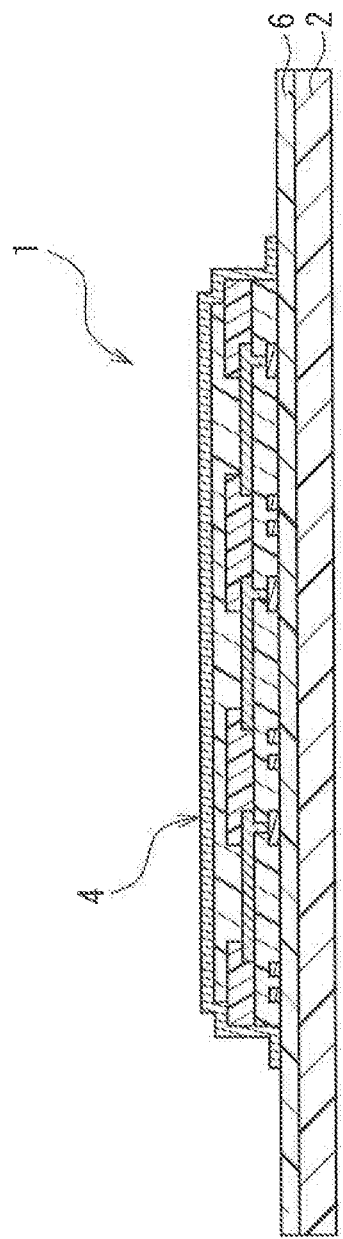
FIGS. 4(a) and 4(b) illustrate a series of main manufacturing steps.
Figure 4B:
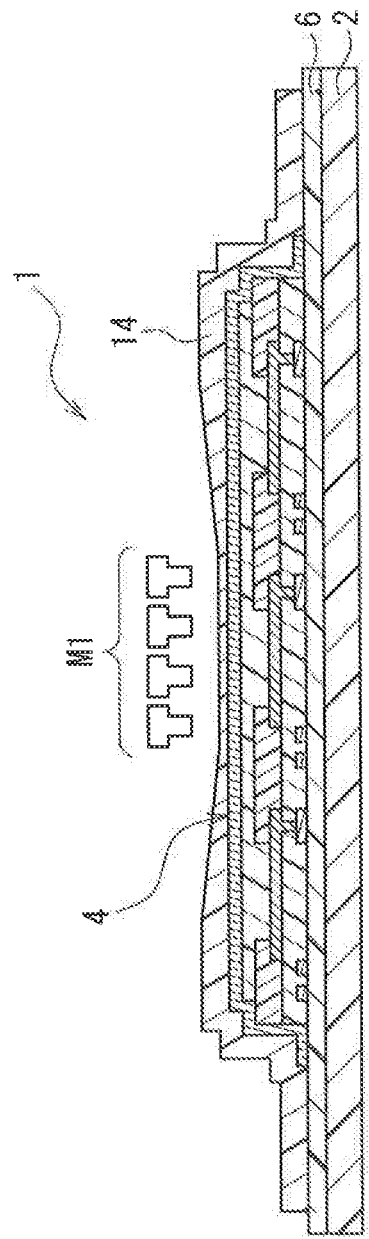
Figure 5A:
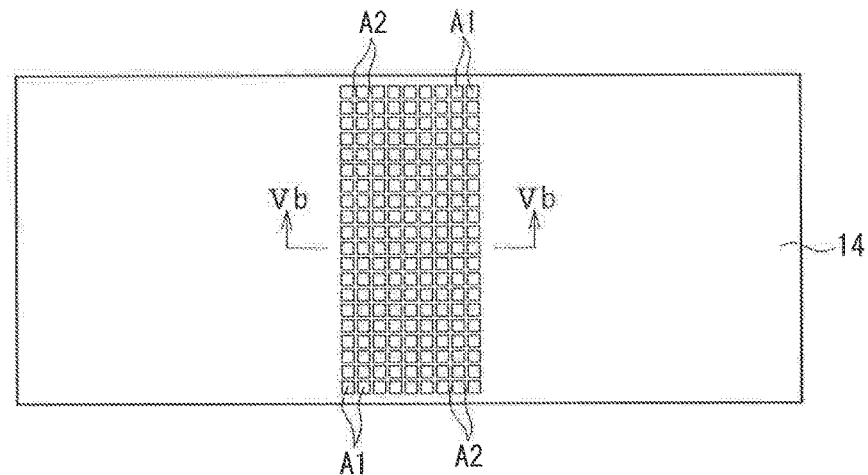
FIG. 5(a) shows an upper surface of a sealing film after the manufacturing step shown in FIG. 4(b) has been finished.
Figure 5B:
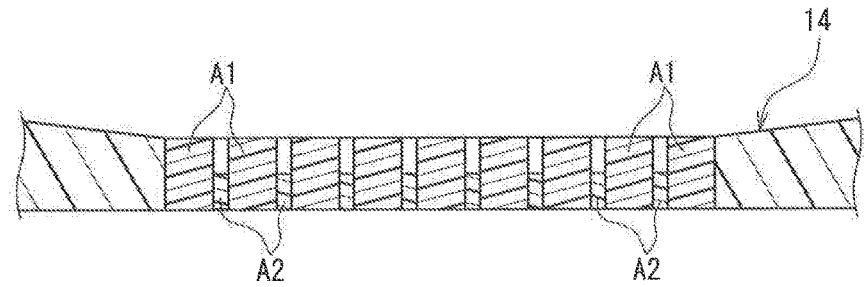
FIG. 5(b) is a cross-sectional view taken along line Vb-Vb in FIG. 5(a)
Figure 5C:
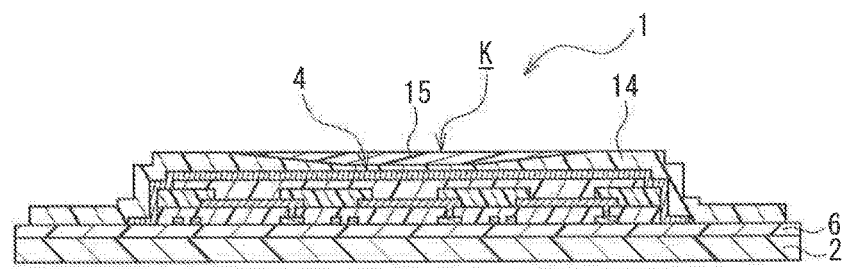
FIG. 5(c) illustrates a manufacturing step that comes after the manufacturing step shown in FIG. 4(b).
Figure 6A:
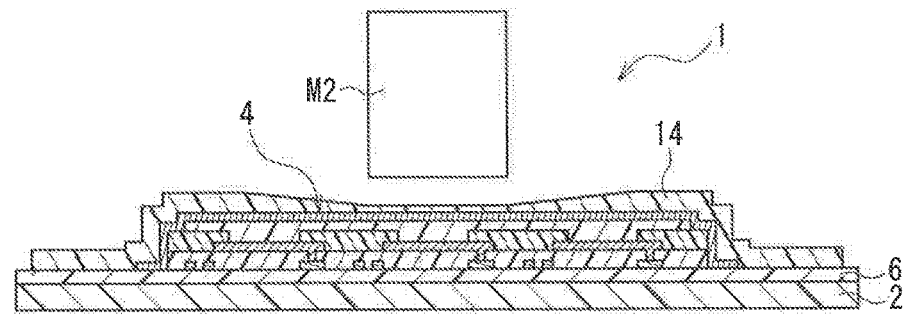
FIG. 6(a) is a diagram for explaining a manufacturing step in the case where another mask is used in the manufacturing step shown in FIG. 4(b)
Figure 6B:
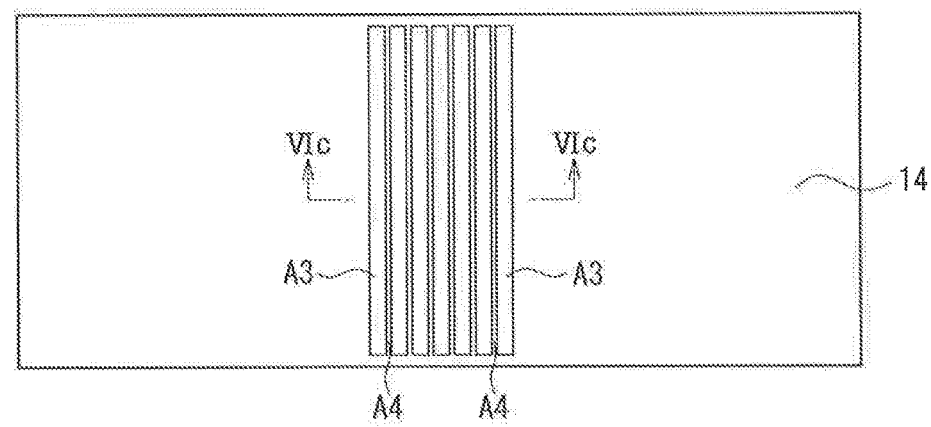
FIG. 6(b) shows an upper surface of another sealing film after the manufacturing step shown in FIG. 6(a) has been finished.
Figure 6C:
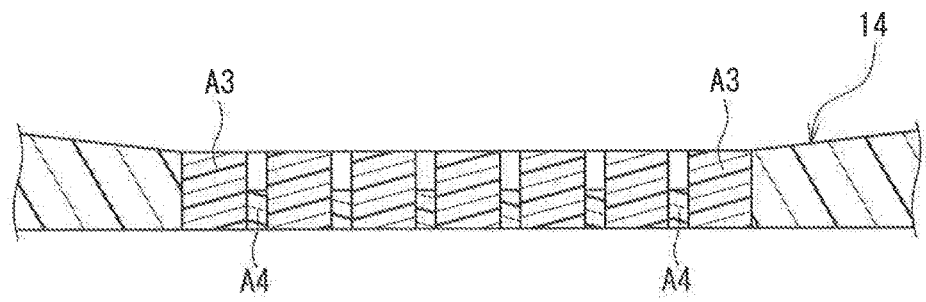
FIG. 6(c) is a cross-sectional view taken along line VIc-VIc in FIG. 6(b).
Figure 7A:
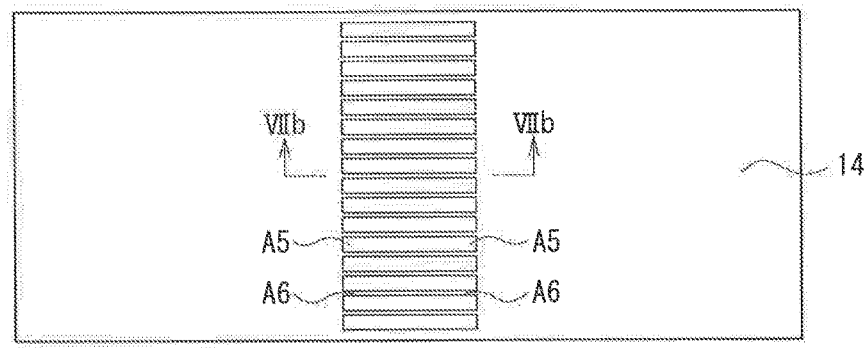
FIG. 7(a) shows an upper surface of another sealing film after the manufacturing step shown in FIG. 6(a) has been finished.
Figure 7B:
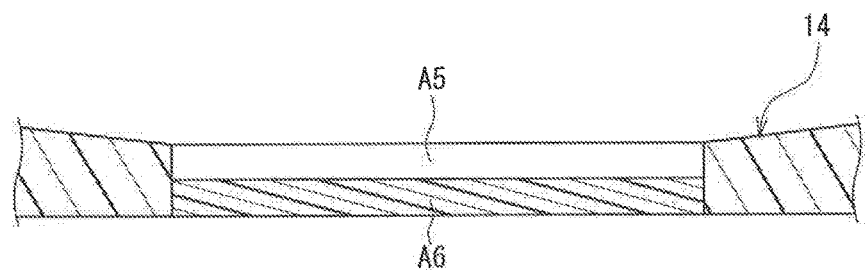
FIG. 7(b) is a cross-sectional view taken along line VIIb-VIIb in FIG. 7(a)
Figure 7C:
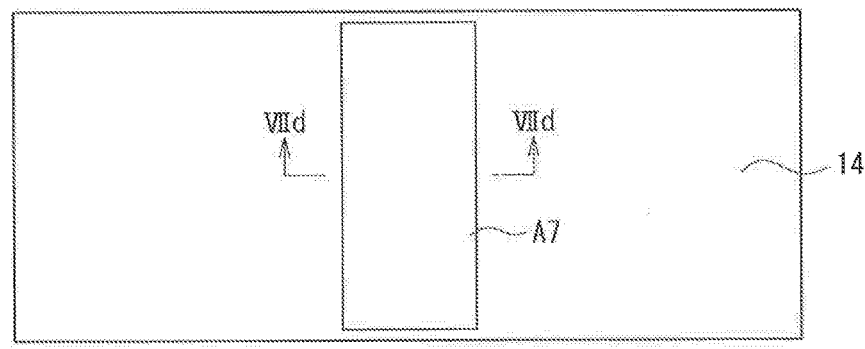
FIG. 7(c) shows an upper surface of another sealing film after the manufacturing step shown in FIG. 6(a) has been finished.
Figure 7D:
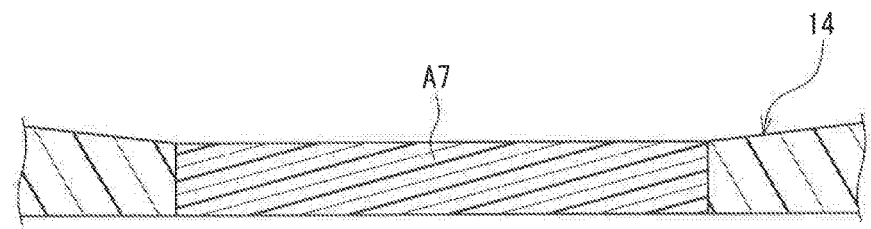
FIG. 7(d) is a cross-sectional view taken along line VIId-VIId in FIG. 7(c).

FIG. 4 shows diagrams for explaining main manufacturing steps for the above-described organic EL display device; FIGS. 4(a) and 4(b) illustrate a series of main manufacturing steps. FIG. 5 shows diagrams for explaining main manufacturing steps for the above-described organic EL display device; FIG. 5(a) shows an upper surface of a sealing film after the manufacturing step shown in FIG. 4(b) has been finished, FIG. 5(b) is cross-sectional view taken along line Vb-Vb in FIG. 5(a), and FIG. 5(c) illustrates a manufacturing step that comes after the manufacturing step shown in FIG. 4(b). FIG. 6(a) is a diagram for explaining a manufacturing step in the case where another mask is used in the manufacturing step shown in FIG. 4(b), FIG. 6(b) shows an upper surface of another sealing film after the manufacturing step shown in FIG. 6(a) has been finished, and FIG. 6(c) is a cross-sectional view taken along line VIc-VIc in FIG. 6(b). FIG. 7(a) shows an upper surface of another sealing film after the manufacturing step shown in FIG. 6(a) has been finished, FIG. 7(b) is a cross-sectional view taken along line VIIb-VIIb in FIG. 7(a), FIG. 7(c) shows an upper surface of another sealing film after the manufacturing step shown in FIG. 6(a) has been finished, and FIG. 7(d) is a cross-sectional view taken along line VIId-VIId in FIG. 7(c).

As shown in FIG. 4(a), to manufacture the organic EL display device 1 of the present embodiment, first, the organic EL element 4 is formed on the TFT substrate 2. That is to say, various constituent elements of the organic EL element 4 are formed in a predetermined order on the base film 6 that has been formed on the TFT substrate 2, and thus, the organic EL element 4 is formed on the TFT substrate 2.

Next, as shown in FIG. 4(b), the sealing film 14 is formed on the organic EL element 4 so as to cover the organic EL element 4. In this step of forming the sealing film 14, the sealing film 14 is formed by using CVD, vapor deposition, or sputtering, for example, and as shown in FIG. 4(b), this step of forming the sealing film 14 is performed in a state in which a mask M1 is placed above the central portion, that is, the bend portion K of the organic EL display device 1. As a result, the sealing film 14 is formed such that its film thickness at the bend portion K is thinner than that at the other portions above which the mask M1 is not placed.

More specifically, as shown in FIG. 4(b), the mask M1 is constituted by a plurality of protruding members that are arranged spaced apart from each other by a predetermined distance. As a result, as shown in FIGS. 5(a) and 5(b), at the bend portion K, the film thickness of a plurality of protruding portions A1 of the sealing film 14 is reduced, and the plurality of protruding portions A1 are formed in a mesh-shaped pattern. Also, a plurality of protruding portions A2 are formed in a mesh-shaped pattern between the plurality of protruding portions A1, the plurality of protruding portions A2 having an even thinner film thickness than that of the protruding portions A1, for example, a thickness that is about ½ the thickness of the protruding portions A1. Thus, at the bend portion K of the sealing film 14, the plurality of protruding portions A1 and A2 are formed in such a manner as to create steps between each other, and therefore, it is possible to easily bend the bend portion K without exposing the organic EL element 4.

After that, as shown in FIG. 5(c), the resin material 15 is applied onto the sealing film 14 by using an ODF (one drop fill) method, for example, and thus, the organic El display device 1 is completed. Moreover, even the inside of portions surrounded by the protruding portions A1 and A2 (i.e., in FIG. 5(b), portions shown as gaps over the protruding portions A2) is filled with the resin material 15.

The step of forming the sealing film 14 is not limited to the foregoing description. For example, as shown in FIG. 6(a) by way of example, in the step of forming the sealing film 14, it is also possible to form the sealing film 14 in a state in which a mask M2 having a box shape, for example, is placed above the bend portion K. Moreover, in the case where such mask M2 is used, depending on the structure of the mask M2, it is possible to form the portion in which the film thickness of the sealing film 14 is reduced with various patterns.

More specifically, as shown in FIGS. 6(b) and 6(c), at the bend portion, the film thickness of a plurality of protruding portions A3 of the sealing film 14 may be reduced, and the plurality of protruding portions A3 may be formed parallel to the longitudinal direction of the sealing film 14 (i.e., longitudinal direction of the organic EL display device 1) while being spaced apart from each other by a predetermined distance. Moreover, a plurality of protruding portions A4 may also be formed between adjacent two protruding portions A3 so as to extend parallel to the longitudinal direction of the sealing film 14 while being spaced apart from each other by a predetermined distance, the plurality of protruding portions A4 having an even thinner film thickness than that of the protruding portions A3, for example, a thickness that is about ½ the thickness of the protruding portions A3. Thus, at the bend portion K of the sealing film 14, the plurality of protruding portions A3 and A4 are formed in such a manner as to create steps between each other, and therefore, it is possible to easily bend the bend portion K without exposing the organic EL element 4.

Moreover, even the inside of portions surrounded by the protruding portions A3 and A4 (i.e., in FIG. 6(c), portions shown as gaps over the protruding portions A4) is filled with the above-described resin material 15.

As shown in FIGS. 7(a) and 7(b), at the bend portion, the film thickness of a plurality of protruding portions A5 of the sealing film 14 may be reduced, and the plurality of protruding portions A5 may be formed parallel to the lateral direction of the sealing film 14 (i.e., lateral direction of the organic EL display device 1) while being spaced apart from each other by a predetermined distance. Moreover, a plurality of protruding portions A6 may also be formed between adjacent two protruding portions A5 so as to extend parallel to the lateral direction of the sealing film 14 while being spaced apart from each other by a predetermined distance, the plurality of protruding portions A5 having an even thinner film thickness than that of the protruding portions A5, for example, a thickness that is about ½ the thickness of the protruding portions A5. Thus, at the bend portion K of the sealing film 14, the plurality of protruding portions A5 and A6 are formed in such a manner as to create steps between each other, and therefore, it is possible to easily bend the bend portion K without exposing the organic EL element 4.

Moreover, even the inside of portions surrounded by the protruding portions A5 and A6 (i.e., in FIG. 7(b), a portion shown as a gap over a given one of the protruding portions A6) is filled with the above-described resin material 15.

As shown in FIGS. 7(c) and 7(d), a rectangular portion A7 where the film thickness is reduced may also be formed.

In the organic EL display device 1 of the present embodiment that is configured as described above, the foldable bend portion K is provided. Moreover, at this bend portion K, the film thickness of the sealing film 14 is reduced. As a result, according to the present embodiment, unlike the above-described conventional examples, it is possible to configure the organic EL display device (electroluminescence device) 1 in which the sealing film 14 can be prevented from peeling off even when the device is folded and which therefore has excellent reliability.

Moreover, according to the present embodiment, since the organic EL display device 1 having excellent reliability in which the sealing film 14 can be prevented from peeling off even when the device is folded is used, it is possible to configure a highly-reliable, long-life electronic device.

Second Embodiment

Figure 8:
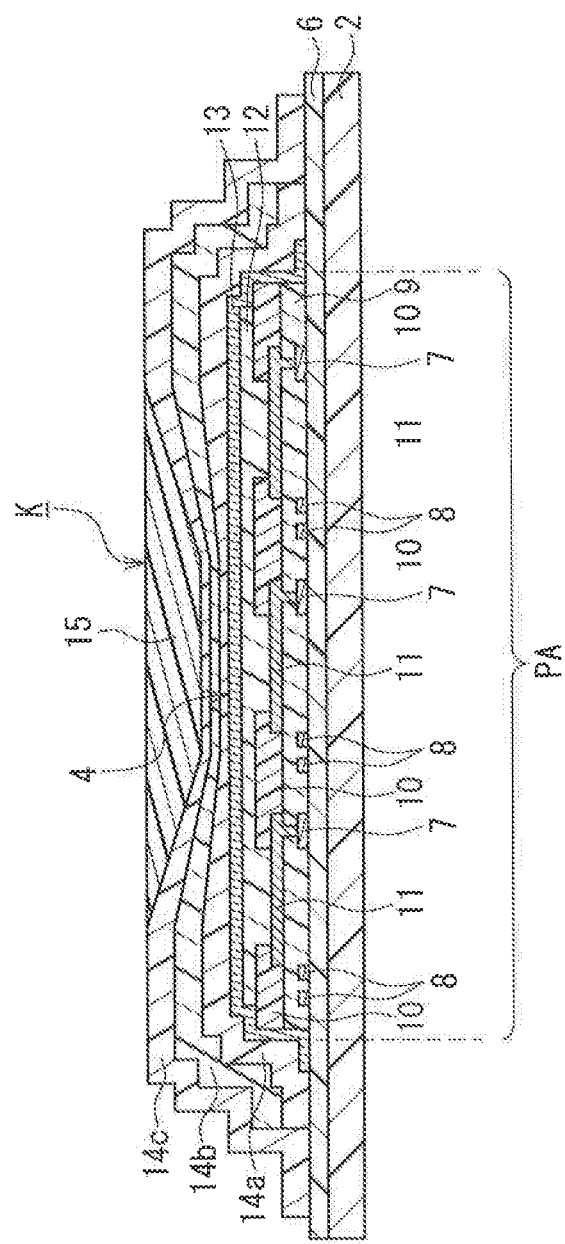
FIG. 8 is a cross-sectional view of an organic EL display device according to a second embodiment of the present invention.

FIG. 8 is a cross-sectional view of an organic EL display device according to a second embodiment of the present invention.

In the drawing, the present embodiment differs from the above-described first embodiment mainly in that a sealing film having a laminated structure of an inorganic film and an organic film is used. It should be noted that elements that are the same as those of the above-described first embodiment are denoted by the same reference numerals, and their redundant description is omitted.

That is to say, as shown in FIG. 8, in the organic EL display device 1 of the present embodiment, the sealing film 14 has a laminated structure including, for example, an inorganic film 14a that is provided on the organic EL element 4 side, an organic film 14b that is provided on the inorganic film 14a, and an inorganic film 14c that is provided so as to cover the organic film 14b.

As in the case of the sealing film of the first embodiment, for example, silicon nitride, silicon oxide, silicon oxynitride, or aluminum oxide is used for the inorganic films 14a and 14c. Meanwhile, for example, silicon oxycarbide, acrylate, polyurea, parylene, polyimide, or polyamide is used for the organic film 14b.

Moreover, in the organic EL display device 1 of the present embodiment, since the inorganic film 14a is provided on the organic EL element 4 side, the inorganic film 14a can more reliably prevent moisture from having an adverse effect on the organic EL element 4. In addition, since the organic film 14b is provided on the inorganic film 14a, even if a defect such as a pinhole occurs in the inorganic film 14a, the organic film 14b can cover the defect, and thus, a decrease in sealing properties of the sealing film 14 can be more reliably prevented.

Moreover, in the organic EL display device 1 of the present embodiment, as in the case of the first embodiment, the foldable bend portion K is provided at the central portion of the pixel area PA Furthermore, in the organic EL display device 1 of the present embodiment, the film thickness of the sealing film 14 is partially reduced as in the case of the first embodiment. That is to say, as shown in FIG. 8, the sealing film 14 is formed such that the film thickness of each of the inorganic film 14a, the organic film 14b, and the inorganic film 14c is gradually reduced toward the bend portion K from both the left and right end portions, and is thinnest at the bend portion K.

Moreover, in the organic EL display device 1 of the present embodiment, as in the case of the first embodiment, as shown in FIG. 8, in the recessed portion of the sealing film 14 where the film thickness of the sealing film 14 is reduced, the resin material 15 is provided on the inorganic film 14c of the sealing film 14 such that the recessed portion is filled with the resin material 15.

Configured as described above, the present embodiment can have effects similar to those of the above-described first embodiment. Moreover, according to the present embodiment, since the sealing film 14 has a laminated structure including the inorganic films 14a and 14c and the organic film 14b, the sealing properties of the sealing film 14 can be easily improved.

Third Embodiment

Figure 9:
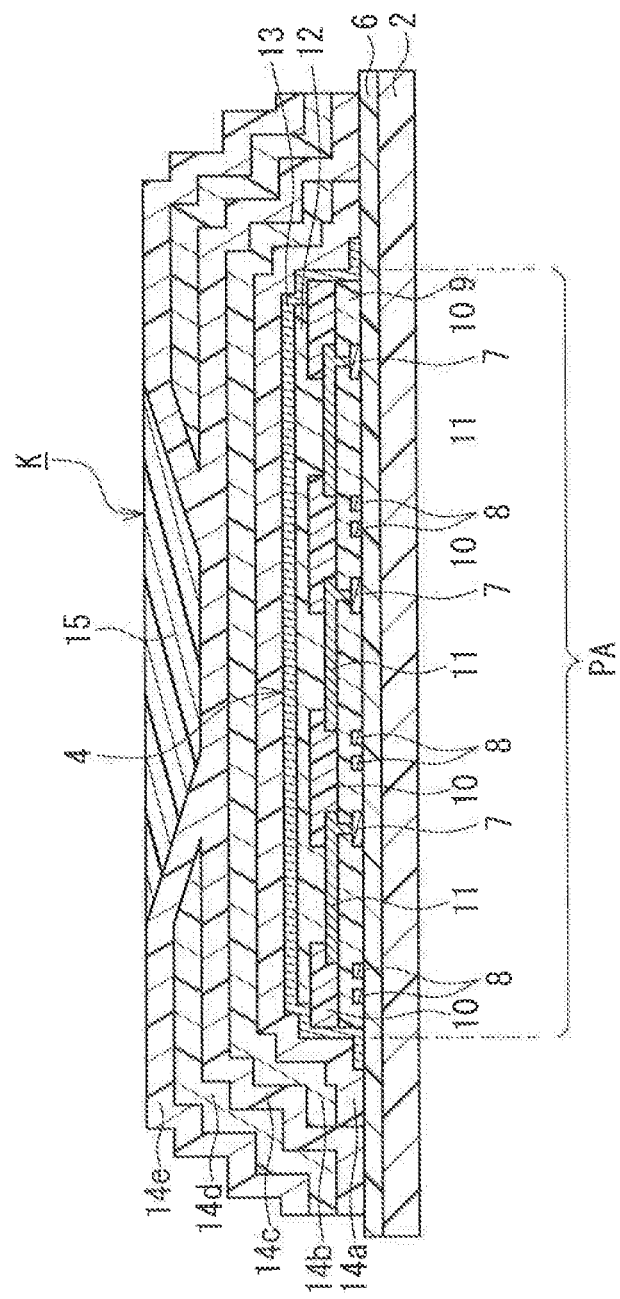
FIG. 9 is a cross-sectional view of an organic EL display device according to a third embodiment of the present invention.

FIG. 9 is a cross-sectional view of an organic EL display device according to a third embodiment of the present invention.

In the drawing, the present embodiment differs from the above-described second embodiment mainly in that in the sealing film, an organic film is provided sandwiching the bend portion from both sides. It should be noted that elements that are the same as those of the above-described second embodiment are denoted by the same reference numerals, and their redundant description is omitted.

That is to say, as shown in FIG. 9, in the organic EL display device 1 of the present embodiment, the sealing film 14 has a laminated structure including, for example, the inorganic film 14a provided on the organic EL element 4 side, the organic film 14b provided on the inorganic film 14a, the inorganic film 14c provided so as to cover the organic film 14b, an organic film 14d provided on the inorganic film 14c, and an inorganic film 14e provided on the organic film 14d.

As in the case of the sealing film of the first embodiment, for example, silicon nitride, silicon oxide, silicon oxynitride, or aluminum oxide is used for the inorganic film 14e. Moreover, as in the case of the organic film of the second embodiment, for example, silicon oxycarbide, acrylate, polyurea, parylene, polyimide, or polyamide is used for the organic film 14d.

Moreover, in the organic EL display device 1 of the present embodiment, as in the case of the first embodiment, the foldable bend portion K is provided at the central portion of the pixel area PA Furthermore, in the organic EL display device 1 of the present embodiment, the film thickness of the sealing film 14 is partially reduced as in the case of the first embodiment. That is to say, as shown in FIG. 9, the sealing film 14 is formed such that the organic film 14d is provided sandwiching the bend portion K from both sides, and at the bend portion K, the film thickness of the inorganic films 14c and 14e is reduced, and the two inorganic films are integrated together.

Moreover, in the organic EL display device 1 of the present embodiment, as in the case of the first embodiment, as shown in FIG. 9, in the recessed portion of the sealing film 14 where the film thickness of the sealing film 14 is reduced, the resin material 15 is provided on the inorganic film 14e of the sealing film 14 such that the recessed portion is filled with the resin material 15.

Configured as described above, the present embodiment can have effects similar to those of the above-described second embodiment. Moreover, according to the present embodiment, in the sealing film 14, the organic film 14d is provided sandwiching the bend portion K from both sides, which means that in the sealing film 14, the organic film 14d is not provided at the bend portion K, and thus, the sealing film 14 can be easily prevented from peeling off at the bend portion K.

Modification of Third Embodiment

Figure 10:
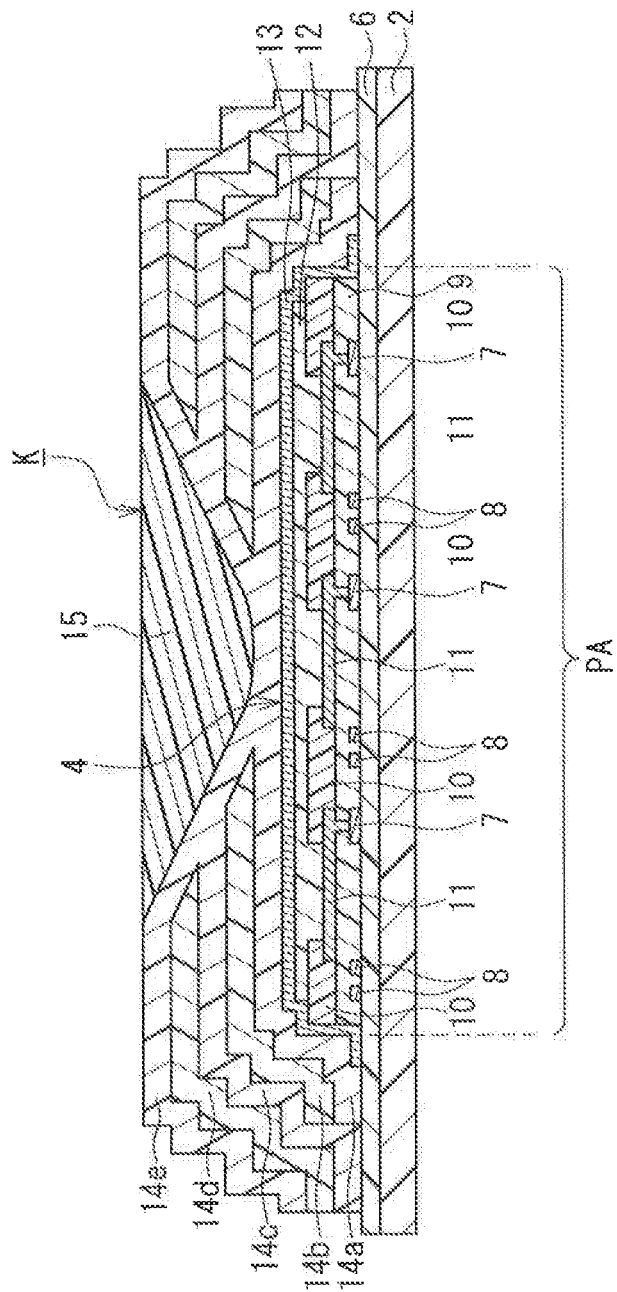
FIG. 10 is a cross-sectional view of a modification of the organic EL display device according to the third embodiment of the present invention.

FIG. 10 is a cross-sectional view of a modification of the organic EL display device according to the third embodiment of the present invention.

In the drawing, the present embodiment differs from the above-described third embodiment mainly in that, in the sealing film, all of the organic films are provided sandwiching the bend portion from both sides. It should be noted that elements that are the same as those of the above-described third embodiment are denoted by the same reference numerals, and their redundant description is omitted.

That is to say, as shown in FIG. 10, in the organic EL display device 1 of the present modification, not only the organic film 14d but also the organic film 14b is provided sandwiching the bend portion K from both sides. Moreover, in the sealing film 14 of the present embodiment, at the bend portion K, the film thickness of the inorganic films 14a, 14c, and 14e is reduced, and the three inorganic films 14a, 14c, and 14e are integrated together.

Configured as described above, the present embodiment can have effects similar to those of the above-described third embodiment.

Fourth Embodiment

Figure 11:
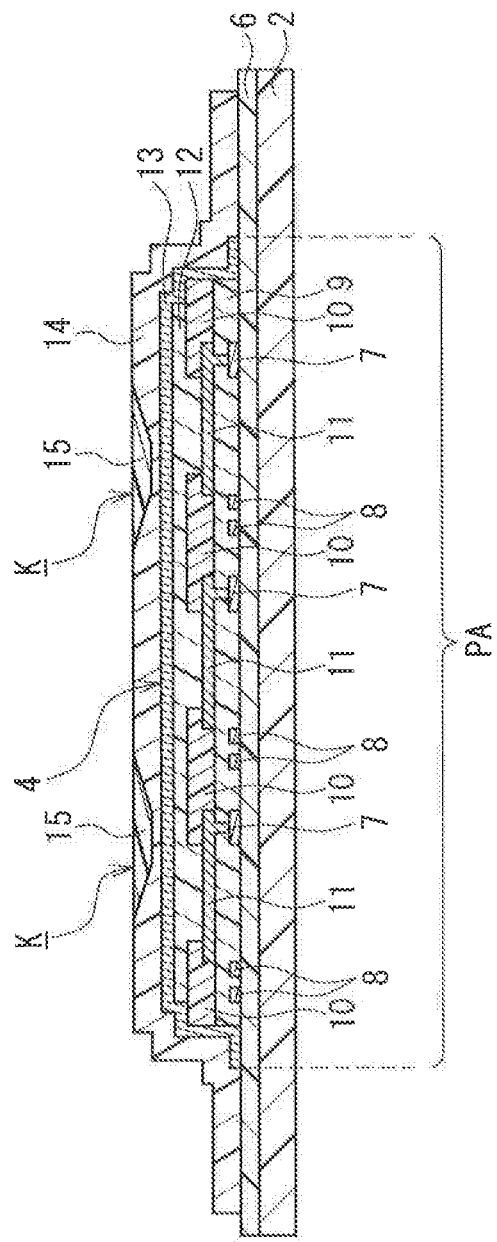
FIG. 11 is a cross-sectional view of an organic EL display device according to a fourth embodiment of the present invention.
Figure 12:
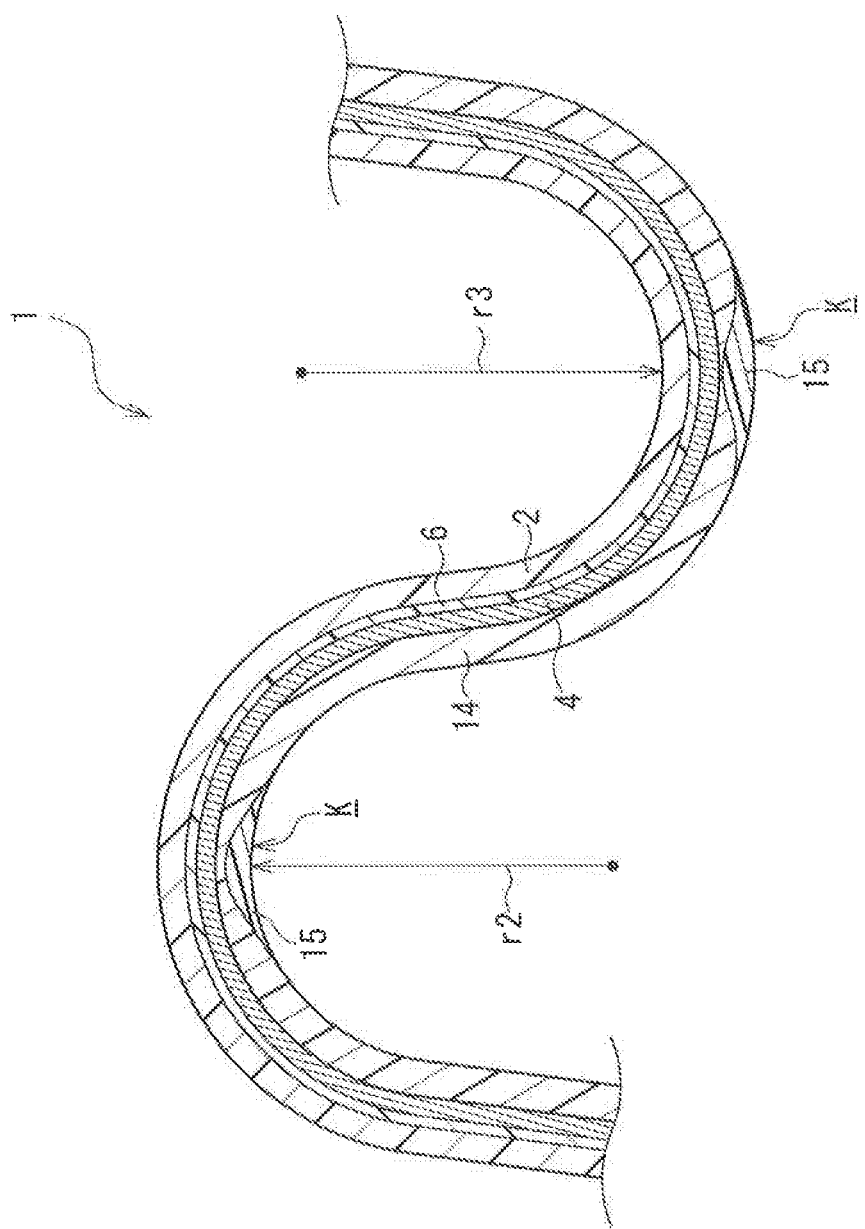
FIG. 12 is an explanatory diagram for explaining the organic EL display device shown in FIG. 11 in a folded state.

FIG. 11 is a cross-sectional view of an organic EL display device according to a fourth embodiment of the present invention. FIG. 12 is an explanatory diagram for explaining the organic EL display device shown in FIG. 11 in a folded state.

In the drawings, the present embodiment differs from the above-described first embodiment mainly in that a plurality of bend portions are provided, and the film thickness of the sealing film is reduced at each of the plurality of bend portions. It should be noted that elements that are the same as those of the above-described first embodiment are denoted by the same reference numerals, and their redundant description is omitted.

That is to say, as shown in FIG. 11, in the organic EL display device 1 of the present embodiment, a plurality of, for example, two bend portions K are provided within the pixel area PA Moreover, the sealing film 14 is provided such that the film thickness of the sealing film 14 is partially reduced at each of the two bend portions K. Moreover, the bend portions K are provided at respective positions approximately one-third of the left-right length of the organic EL display device 1 from the left and right ends thereof.

Moreover, as shown in FIG. 12 by way of example, the organic EL display device 1 of the present embodiment is capable of displaying information in a state in which the device is folded at the bend portions K. That is to say, the organic EL display device 1 of the present embodiment is folded at the bend portion K on the left side in FIG. 12 such that the sealing film 14 is located on the inner side, and is also folded at the bend portion K on the right side in FIG. 12 such that the sealing film 14 is located on the outer side. Moreover, at the bend portion K on the left side in FIG. 11, the device is folded with a radius of curvature (indicated by "r2" in FIG. 12) of about several millimeters, for example. Similarly, at the bend portion K on the right side in FIG. 12, the device is folded with a radius of curvature (indicated by "r3" in FIG. 12) of about several millimeters, for example.

Configured as described above, the present embodiment can have effects similar to those of the above-described first embodiment. Moreover, according to the present embodiment, two bend portions K are provided, and the film thickness of the sealing film 14 is reduced at each of the two bend portions K. Therefore, the organic EL display device 1 can be folded at a plurality of bend portions K as shown in FIG. 12 by way of example in a state in which the sealing film 14 is prevented from peeling off.

Fifth Embodiment

Figure 13:
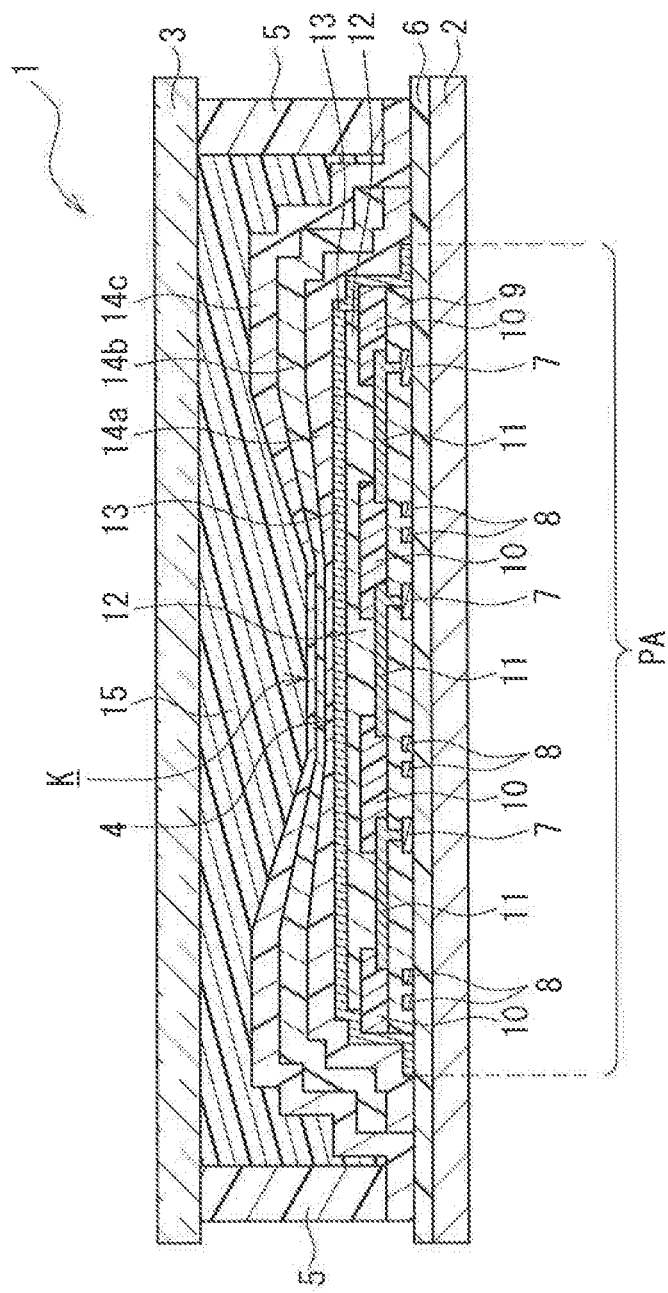
FIG. 13 is a cross-sectional view of an organic EL display device according to a fifth embodiment of the present invention.

FIG. 13 is a cross-sectional view of an organic EL display device according to a fifth embodiment of the present invention.

In the drawing, the present embodiment differs from the above-described first embodiment mainly in that an opposing substrate that opposes the TFT substrate and a frame-shaped seal material that encloses the organic EL element between the TFT substrate and the opposing substrate are provided. It should be noted that elements that are the same as those of the above-described first embodiment are denoted by the same reference numerals, and their redundant description is omitted.

That is to say, as shown in FIG. 13, in the organic EL display device 1 of the present embodiment, the organic EL element 4 is enclosed by the TFT substrate 2, an opposing substrate 3 that is provided opposing the TFT substrate 2, and a frame-shaped seal material 5 that is provided between the TFT substrate 2 and the opposing substrate 3.

As in the case of the TFT substrate 2, a film or the like having flexibility (bendability), for example, is used as the opposing substrate 3.

The seal material 5 is composed of a material in which, for example, a spacer that defines a cell gap between the TFT substrate 2 and the opposing substrate 3 as well as inorganic particles are dispersed in a resin such as epoxy resin, and the seal material 5 is formed in the form of a frame around the pixel area PA. Moreover, as a result of dispersing the inorganic particles, the moisture permeability of the seal material 5 can be reduced even more.

Moreover, in the organic EL display device 1 of the present embodiment, as in the case of the second embodiment, the bend portion K is provided, and the film thickness of the sealing film 14 is partially reduced at the bend portion K. As a result, the organic EL display device 1 of the present embodiment is foldable at the bend K as in the case of the second embodiment.

Moreover, in the organic EL display device 1 of the present embodiment, the resin material 15 is provided so as to cover the sealing film 14 while being surrounded by the TFT substrate 2, the opposing substrate 3, and the seal material 5.

Configured as described above, the present embodiment can have effects similar to those of the above-described first embodiment. Moreover, according to the present embodiment, since the opposing substrate 3 that opposes the TFT substrate 2 and the seal material 5 that encloses the organic EL element 4 between the TFT substrate 2 and the opposing substrate 3 are provided, deterioration of the organic EL element 4 can be more reliably prevented.

It should be noted that the foregoing embodiments are to be considered in all respects as illustrative and not restrictive. The technical scope of the invention is indicated by the appended claims, and all changes which come within the range of equivalency of the configurations specified in the claims are therefore intended to be embraced therein.

For example, although the case where an organic EL element is used as the electroluminescence element has been described in the foregoing description, the present invention is not limited to this, and, for example, an inorganic EL element containing an inorganic compound may also be used.

Moreover, although the case where, at the bend portion, an elastic resin material is provided on the sealing film has been described in the foregoing description, the present invention is not limited provided that the film thickness of the sealing film is reduced at a foldable bend portion, and a configuration may also be adopted in which the above-described resin material is omitted. However, as described above, providing an elastic resin material on the sealing film is preferred in that this makes it possible to easily improve the strength of the electroluminescence device while suppressing a decrease in the ease of folding at the bend portion.

Moreover, in the first, second, third, and fifth embodiments, the case where a single bend portion is provided has been described, and in the fourth embodiment, the case where two bend portions are provided has been described. However, the bend portion of the present invention is not limited to these cases. It is sufficient if a bend portion is formed at a position in the electroluminescence device where the bend portion has approximately 2-fold rotational symmetry, that is, at a position where the bend portion is situated at the same position even after the electroluminescence device is rotated by 180°. More specifically, as shown in the foregoing embodiments, for example, a bend portion may be provided at a central portion with respect to the left-right direction of the electroluminescence device, or bend portions may be provided at respective positions approximately one-third of the left-right length of the electroluminescence device from the left and right ends thereof. Alternatively, for example, bend portions may be provided at respective positions approximately one-fourth of the left-right length of the electroluminescence device from the left and right ends thereof.

Moreover, in the description of the first embodiment, the case where a sealing film composed of an inorganic film is used has been described, and in the second to fifth embodiments, the case where a sealing film having an at least three-layer laminated structure including an inorganic film and an organic film is used has been described. However, the sealing film of the present invention is not limited to these cases. The use of a sealing film including at least an inorganic film as in the foregoing embodiments, however, is preferred in that this makes it possible to more reliably prevent moisture from having an adverse effect on the electroluminescence element. Moreover, the use of a sealing film having a laminated structure including an inorganic film and an organic film as in the second to fifth embodiments is preferred in that this makes it possible to easily improve the sealing properties of the sealing film.

Moreover, although the case where the present invention is applied to an active-matrix organic EL display device having the TFTs (thin-film transistors) 7 has been described in the foregoing description, the present invention is not limited to this, and the present invention is also applicable to a passive-matrix organic EL display device in which no thin-film transistor is provided.

Moreover, although the case where the present invention is applied to an organic EL display device has been described in the foregoing description, the present invention is not limited to this, and, for example, the present invention is also applicable to an illumination device such as a backlight device.

Moreover, in addition to the foregoing description, the above-described first to fifth embodiments may be combined as appropriate.

INDUSTRIAL APPLICABILITY

The present invention is useful for an electroluminescence device having excellent reliability in which a sealing film can be prevented from peeling off even when the electroluminescence device is folded, an electronic device using the electroluminescence device, and a method for manufacturing the electroluminescence device.

LIST OF REFERENCE NUMERALS

1 Organic EL display device (electroluminescence device)
2 TFT substrate (substrate)
3 Opposing substrate
4 Organic EL element (electroluminescence element)
5 Seal material
14, 14a, 14b, 14c, 14d, 14e Sealing film
15 Resin material
K Bend portion
A1 to A6 Protruding portion

The invention claimed is:

1. An electroluminescence device comprising:
a flexible substrate;
an electroluminescence element that is provided on the flexible substrate;
a sealing film that seals the electroluminescence element;
an opposing substrate that opposes the flexible substrate; and
a frame-shaped seal material that is provided between the flexible substrate and the opposing substrate and that encloses the electroluminescence element together with the flexible substrate and the opposing substrate, wherein
the electroluminescence device is provided with a foldable bend portion, and
a film thickness of the sealing film is reduced at the foldable bend portion.

2. The electroluminescence device according to claim 1, wherein the electroluminescence device is provided with a plurality of said bend portions, and
the film thickness of the sealing film is reduced at each of the plurality of bend portions.

3. The electroluminescence device according to claim 1, wherein the sealing film has a plurality of protruding portions at the bend portion, the film thickness of the plurality of protruding portions being reduced and the plurality of protruding portions being formed in a mesh-shaped pattern.

4. The electroluminescence device according to claim 1, wherein the sealing film has a plurality of protruding portions at the bend portion, the film thickness of the plurality of protruding portions being reduced and the plurality of protruding portions being formed parallel to each other while being spaced apart from each other by a predetermined distance.

5. The electroluminescence device according to claim 1, wherein the sealing film includes at least an inorganic film.

6. The electroluminescence device according to claim 5, wherein in the sealing film, an organic film is provided sandwiching the bend portion from both sides thereof.

7. The electroluminescence device according to claim 1, wherein the sealing film has a laminated structure including an inorganic film and an organic film.

8. The electroluminescence device according to claim 1, wherein at the bend portion, an elastic resin material is provided on the sealing film.

9. An electronic device using the electroluminescence device according to claim 1.

10. An electroluminescence device comprising:
a flexible substrate;
an electroluminescence element that is provided on the substrate; and
a sealing film that seals the electroluminescence element, wherein
the electroluminescence device is provided with a foldable bend portion,
a film thickness of the sealing film is reduced at the bend portion, and
the sealing film includes a plurality of protruding portions at the bend portion, a film thickness of the plurality of protruding portions being reduced and the plurality of protruding portions being formed in a mesh-shaped pattern.

11. The electroluminescence device according to claim 10, wherein the plurality of protruding portions being formed parallel to each other while being spaced apart from each other by a predetermined distance.

12. The electroluminescence device according to claim 10, wherein the sealing film includes at least an inorganic film.

13. The electroluminescence device according to claim 12, wherein in the sealing film, an organic film is provided sandwiching the bend portion from both sides thereof.

14. The electroluminescence device according to claim 10, wherein the sealing film has a laminated structure including an inorganic film and an organic film.

15. The electroluminescence device according to claim 10, wherein at the bend portion, an elastic resin material is provided on the sealing film.

16. An electronic device using the electroluminescence device according to claim 10.

17. An electroluminescence device comprising:
a flexible substrate;
an electroluminescence element that is provided on the substrate; and
a sealing film that seals the electroluminescence element, wherein
the electroluminescence device is provided with a foldable bend portion,
a film thickness of the sealing film is reduced at the bend portion, and the sealing film has a plurality of protruding portions at the bend portion, the film thickness of the plurality of protruding portions being reduced and the plurality of protruding portions being formed parallel to each other while being spaced apart from each other by a predetermined distance.

18. The electroluminescence device according to claim 17, wherein the sealing film includes at least an inorganic film.

19. The electroluminescence device according to claim 18, wherein in the sealing film, an organic film is provided sandwiching the bend portion from both sides thereof.

20. The electroluminescence device according to claim 17, wherein the sealing film has a laminated structure including an inorganic film and an organic film.

21. The electroluminescence device according to claim 17, wherein at the bend portion, an elastic resin material is provided on the sealing film.

* * * * *